(12) United States Patent
Anderson et al.

(10) Patent No.: US 8,169,007 B2
(45) Date of Patent: May 1, 2012

(54) ASYMMETRIC JUNCTION FIELD EFFECT TRANSISTOR

(75) Inventors: Frederick G. Anderson, South Burlington, VT (US); David S. Collins, Williston, VT (US); Richard A. Phelps, Colchester, VT (US); Robert M. Rassel, Colchester, VT (US); Michael J. Zierak, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/037,485

(22) Filed: Mar. 1, 2011

(65) Prior Publication Data

US 2011/0147808 A1    Jun. 23, 2011

Related U.S. Application Data

(62) Division of application No. 12/388,586, filed on Feb. 19, 2009, now Pat. No. 7,943,445.

(51) Int. Cl.
*H01L 29/00* (2006.01)
*H01L 29/76* (2006.01)

(52) U.S. Cl. ............... 257/270; 257/67; 257/365

(58) Field of Classification Search .......... 257/67, 257/270, 272, 287, 365, 366, 401, E29.264, 257/E29.268, E29.279
See application file for complete search history.

(56) References Cited

U.S. PATENT DOCUMENTS

| 4,753,899 A | 6/1988 | Colquhoun |
| 5,637,898 A | 6/1997 | Baliga |
| 6,100,111 A | 8/2000 | Konstantinov |
| 6,342,717 B1 * | 1/2002 | Komatsu ............... 257/347 |
| 6,504,173 B2 * | 1/2003 | Hsu et al. ............... 257/60 |
| 6,545,316 B1 | 4/2003 | Baliga |
| 7,341,915 B2 * | 3/2008 | Li et al. ............... 438/283 |
| 2005/0001268 A1 | 1/2005 | Baliga |
| 2006/0261419 A1 | 11/2006 | Kreupl et al. |
| 2007/0012988 A1 | 1/2007 | Bhattacharyya |
| 2007/0262321 A1 | 11/2007 | Harris et al. |
| 2008/0001183 A1 | 1/2008 | Kapoor |
| 2008/0001198 A1 | 1/2008 | Jeon et al. |
| 2008/0067560 A1 | 3/2008 | Knaipp |
| 2008/0191277 A1 | 8/2008 | Disney et al. |

FOREIGN PATENT DOCUMENTS

| JP | 61100975 A1 | 5/1986 |
| WO | 2009108311 A2 | 9/2009 |

* cited by examiner

*Primary Examiner* — Hung Vu
(74) *Attorney, Agent, or Firm* — Scully, Scott, Murphy & Presser, P.C.; Richard M. Kotulak, Esq.

(57) ABSTRACT

A junction field effect transistor (JFET) in a semiconductor substrate includes a source region, a drain region, a channel region, an upper gate region, and a lower gate region. The lower gate region is electrically connected to the upper gate region. The upper and lower gate regions control the current flow through the channel region. By performing an ion implantation step that extends the thickness of the source region to a depth greater than the thickness of the drain region, an asymmetric JFET is formed. The extension of depth of the source region relative to the depth of the drain region reduces the length for minority charge carriers to travel through the channel region, reduces the on-resistance of the JFET, and increases the on-current of the JFET, thereby enhancing the overall performance of the JFET without decreasing the allowable Vds or dramatically increasing Voff/Vpinch.

15 Claims, 16 Drawing Sheets

ASYMMETRIC JUNCTION FIELD EFFECT TRANSISTOR

CROSS REFERENCE TO RELATED APPLICATION

This application is a divisional of U.S. patent application Ser. No. 12/388,586, filed Feb. 19, 2009 the entire content and disclosure of which is incorporated herein by reference.

FIELD OF THE INVENTION

The present invention relates to semiconductor structures and particularly to a junction field effect transistor (JFET) having a low on-resistance, and methods of manufacturing the

BACKGROUND OF THE INVENTION

Solid state power amplifiers are advantageous for their compact size and easy integration into semiconductor circuit components. Unfortunately, methods of manufacture for present day semiconductor power amplifiers require a semiconductor substrate dedicated to power amplifier devices or many processing steps in addition to common semiconductor processing steps for typical semiconductor complementary metal-oxide-semiconductor (CMOS) devices or their variants.

For example, high-end power amplifiers are built in gallium arsenide (GaAs) technologies, which require a GaAs substrate and dedicated processing steps that are not compatible with silicon-based CMOS technologies. As a result, the power amplifiers that utilize GaAs technologies tend to be costly. Middle-range power amplifiers are built in modified silicon germanium bipolar complementary metal-oxide-semiconductor (SiGe BiCMOS) technologies developed for high voltage power applications. Even modified SiGe BiCMOS technologies tend to add its own cost associated with enabling power amplifiers. Enabling power amplifiers in standard CMOS technologies also tends to introduce many new processing steps and device modifications to accommodate the high voltages that the power amplifiers require, thus also increasing the manufacturing cost for the power amplifiers.

A junction field effect transistor (JFET) is a semiconductor device in which the current between a source and a drain is controlled by the voltage applied to a junction gate terminal, or a "gate." Unlike a metal-oxide-semiconductor field effect transistor (MOSFET), the gate of a JFET is not insulated from the source and the drain. Instead, the body of the transistor and the gate of the transistor form a reverse-biased pn junction with depletion regions both in the gate and in the body. Therefore, the JFET is a depletion mode device with a high input impedance. The input signal is supplied to the gate, typically in the form of a voltage input. The output is the current between the source and the drain which is modulated by the input voltage at the gate. The difference between a depletion mode JFET and an enhancement mode MOSFET is that the JFET is normally "on", i.e. the JFET is on when no gate bias is applied and is turned off with the application of reverse biased gate which increases the depletion region within the channel and pinches off the channel region.

A typical JFET includes a source and a drain that are heavily doped with dopants of a first conductivity type, i.e., p-type or n-type, at a peak dopant concentration typically in the range from $1.0 \times 10^{20}/cm^3$ to $3.0 \times 10^{21}/cm^3$. The body which is technically the channel of the JFET is also doped with dopants of the first conductivity type at a dopant concentration typically in the range from $1.0 \times 10^{17}/cm^3$ to $1.0 \times 10^{19}/cm^3$. A depletion region is formed within the channel along the pn junction boundary. The gate, located on the channel and separated from the source and the drain, is heavily doped with dopants of a second conductivity type, which is the opposite type of the first conductivity type, at a peak dopant concentration typically in the range from $1.0 \times 10^{20}/cm^3$ to $3.0 \times 10^{21}/cm^3$. A voltage bias is applied across a gate contact and the channel to form a reverse biased pn junction between the gate and the channel. The gate contact directly contacts the gate and is typically a metal semiconductor alloy. Metal semiconductor alloy ohmic contacts are also typically used to contact the source and drain regions which are electrically contacted to the channel since similar dopant type.

On a circuit level, the JFET gate presents a small current load, which is the reverse bias leakage of the gate-to-channel junction. The current load of a JFET, i.e., the gate current, is higher than the current load of a typical MOSFET, since the MOSFET has an extremely low gate current, for example, in the range of picoamperes, due to an insulator between the gate and the channel, i.e., a gate dielectric. However, the gate current of a typical JFET is much lower compared to the base current of a typical bipolar junction transistor (BJT), and the transconductance of a typical JFET is higher than that of a typical MOSFET, enabling handling of a higher current. For this reason, JFET's are used in high-input impedance linear amplifier circuits. Use of JFET's as a switch in power semiconductor circuits is also known.

A high on/off impedance ratio is necessary in a JFET to enable high power amplification. To provide such a high on/off impedance ratio, a JFET needs to have a low impedance during the on state, while having a high impedance during the off state. To decrease the impedance in the on state, the cross-sectional area of the channel needs to be increased in a JFET. At the same time, leakage current through the channel needs to be minimized to increase the impedance in the off state.

SUMMARY OF THE INVENTION

The present invention provides a junction field effect transistor (JFET) having an asymmetric source and drain so that source-side on-resistance is reduced and the on-current is increased without degrading the allowable drain voltage or dramatically increasing the required gate voltage to turn the JFET off (i.e. typically known as $V_{off}$ or $V_{pinch}$).

In the present invention, a junction field effect transistor (JFET) in a semiconductor substrate includes a source region, a drain region, a channel region, an upper gate region, and a lower gate region. The lower gate region is electrically connected to the upper gate region. The upper and lower gate regions control the current flow through the channel region. By performing an ion implantation step that extends the thickness of the source region to a depth greater than the thickness of the drain region and extends below the shallow trench isolation, an asymmetric JFET is formed. The extension of depth of the source region relative to the depth of the drain region reduces the length for minority charge carriers to travel vertically and horizontally through the channel region, reduces the on-resistance of the JFET, and increases the on-current of the JFET, thereby enhancing the overall performance of the JFET.

According to an aspect of the present invention, a semiconductor structure is provided, which includes: a body layer including a semiconductor material and having a doping of a first conductivity type and located in a semiconductor substrate; a source region including the semiconductor material and having a doping of the first conductivity type and laterally abutting the body layer; a drain region including the semiconductor material and having a doping of the first conductivity type and laterally abutting the body layer; an upper gate region including the semiconductor material and having a doping of a second conductivity type and vertically abutting a top surface of the body layer, wherein the second conductivity type is the opposite of the first conductivity type; and a lower gate region including the semiconductor material and having a doping of the second conductivity type and vertically abutting a bottom surface of the body layer and laterally abutting sidewalls of the body layer and abutting the upper gate region, wherein the source region and the drain region have substantially coplanar top surfaces, and wherein a bottom surface of the source region is located below a level of a bottom most surface of the drain region.

According to another aspect of the present invention, a method of manufacturing a semiconductor structure is provided, which includes: forming a stack, from bottom to top, of a lower gate region, a body layer, and an upper gate region in a semiconductor substrate including a semiconductor material, wherein the body layer has a doping of a first conductivity type, wherein the lower gate region and the upper gate region have a doping of a second conductivity type, and wherein the second conductivity type is the opposite of the first conductivity type; forming an upper source region and a drain region having a doping of the first conductivity type by doping portions of the body layer with additional dopants of the first conductivity type; and forming a lower source region having a doping of the first conductivity type by doping another portion of the body layer with additional dopants of the first conductivity type, wherein the lower source region and the upper source region constitute a source region of integral construction, and wherein a bottom surface of the upper source region abuts a top surface of the lower source region.

DETAILED DESCRIPTION OF THE INVENTION

Figure 1A:
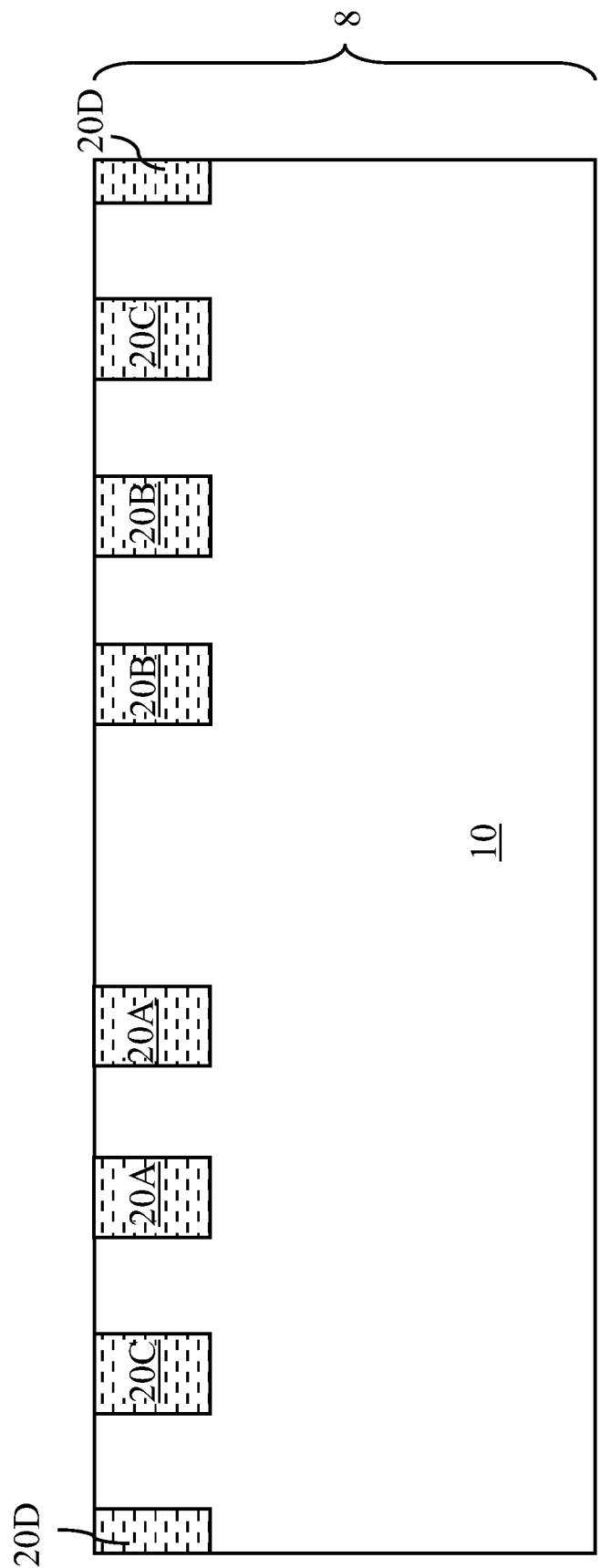
FIGS. 1A-7B are various views of a first exemplary semiconductor structure at various stages of a manufacturing process. Figures with the same numeric label correspond to the same stage of manufacturing. Figures with the suffix "A" are vertical cross-sectional views along the plane A-A' in the figure with the same numeric label and suffix "B." Figures with the suffix "B" are top-down views.

As stated above, the present invention relates to a junction field effect transistor (JFET) having a low on-resistance and methods of manufacturing the same, which are now described in detail with accompanying figures. Throughout the drawings, the same reference numerals or letters are used to designate like or equivalent elements. The drawings are not necessarily drawn to scale.

Figure 1B:
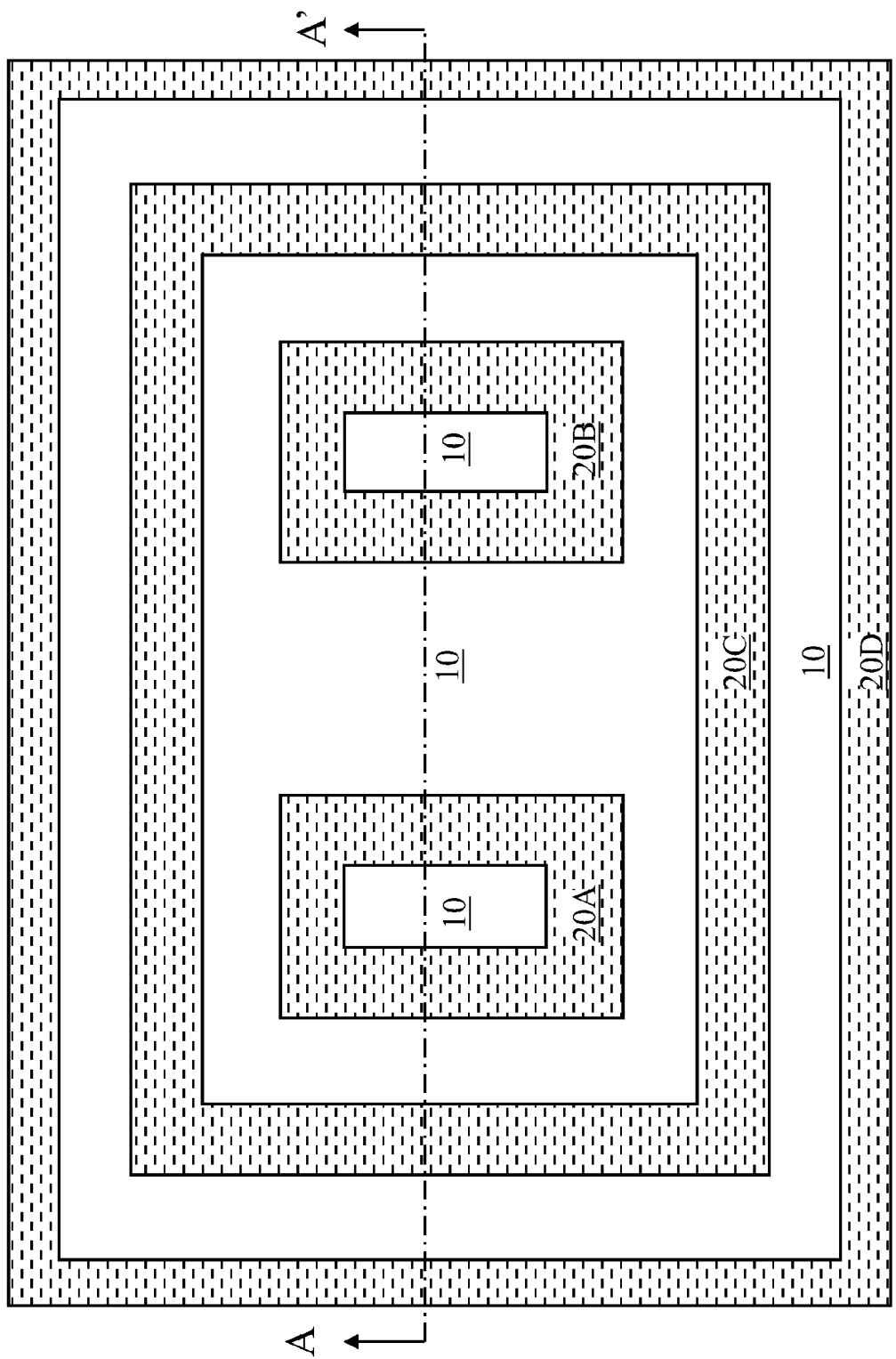

Referring to FIG. 1, a first exemplary semiconductor structure according to a first embodiment of the present invention includes a semiconductor substrate 8 containing a semiconductor layer 10. Preferably, the semiconductor layer 10 includes a semiconductor material such as silicon, germanium, silicon-germanium alloy, silicon carbon alloy, and silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor layer 10 is single crystalline, i.e., atoms are epitaxially aligned in a single crystalline lattice within the semiconductor layer 10.

The semiconductor substrate 8 may be a bulk substrate, a semiconductor-on-insulator (SOI) substrate, or a hybrid substrate including at least one bulk portion and at least one SOI portion.

The semiconductor layer 10 has a doping of a second conductivity type, and is doped with dopants of the second conductivity type. The second conductivity type may be p-type or n-type. The opposite conductivity type of the second conductivity type is herein referred to as a first conductivity type. If the first conductivity type is p-type, the second conductivity type is n-type, and vice versa. The dopant species may be B, In, Ga, or a combination thereof for p-type doping, or may be P, As, Sb, or a combination thereof for n-type doping. The dopant concentration of the semiconductor layer 10 is typically from $3.0 \times 10^{15}/cm^3$ to $3.0 \times 10^{17}/cm^3$, although lesser and greater dopant concentrations are also contemplated herein.

Shallow trench isolation (STI) structures are formed in the semiconductor substrate 10. The shallow trench isolation structures include a first shallow trench isolation structure 20A, a second shallow trench isolation structure 20B, a third shallow trench isolation structure 20C, and a fourth shallow trench isolation structure 20D. Each of the shallow trench isolation structures (20A, 20B, 20C, 20D) extends from a top surface of the semiconductor substrate 8 into the semiconductor substrate 8. The bottom surfaces of the shallow trench isolation structures (20A, 20B, 20C, 20D) may be located at a substantially same depth from the top surface of the semiconductor substrate 8. The depth of the shallow trench isolation structures (20A, 20B, 20C, 20D) may be from 100 nm to 1,000 nm, and typically from 200 nm to 500 nm.

The shallow trench isolation structures (20A, 20B, 20C, 20D) include a dielectric material such as silicon oxide, silicon oxynitride, silicon nitride, or a combination thereof. Each of the shallow trench isolation structures (20A, 20B, 20C, 20D) are separated from one another by portions of the semiconductor layer 10 that extend to the top surface of the semiconductor substrate 8. The first shallow trench isolation structure 20A laterally surrounds a first top portion of the semiconductor layer 10. The second shallow trench isolation structure 20B laterally surrounds a second top portion of the semiconductor layer 10. The distance between the first shallow trench isolation structure 20A and the second shallow trench isolation structure 20B may be from 100 nm to 10 μm, although lesser and greater distances are also contemplated herein. A third top portion of the semiconductor layer 10 laterally surrounds the first shallow trench isolation structure 20A and the second shallow trench isolation structure 20B. A third shallow trench isolation structure 20C laterally surrounds the third top portion of the semiconductor layer 10. A fourth top portion of the semiconductor layer 10 laterally surrounds the third shallow trench isolation structure 20C. The fourth shallow trench isolation structure 20D laterally surrounds the fourth top portion of the semiconductor layer. A fifth top portion (not shown) of the semiconductor layer 10 may laterally surround the fourth shallow trench isolation structure 20D.

Figure 2A:
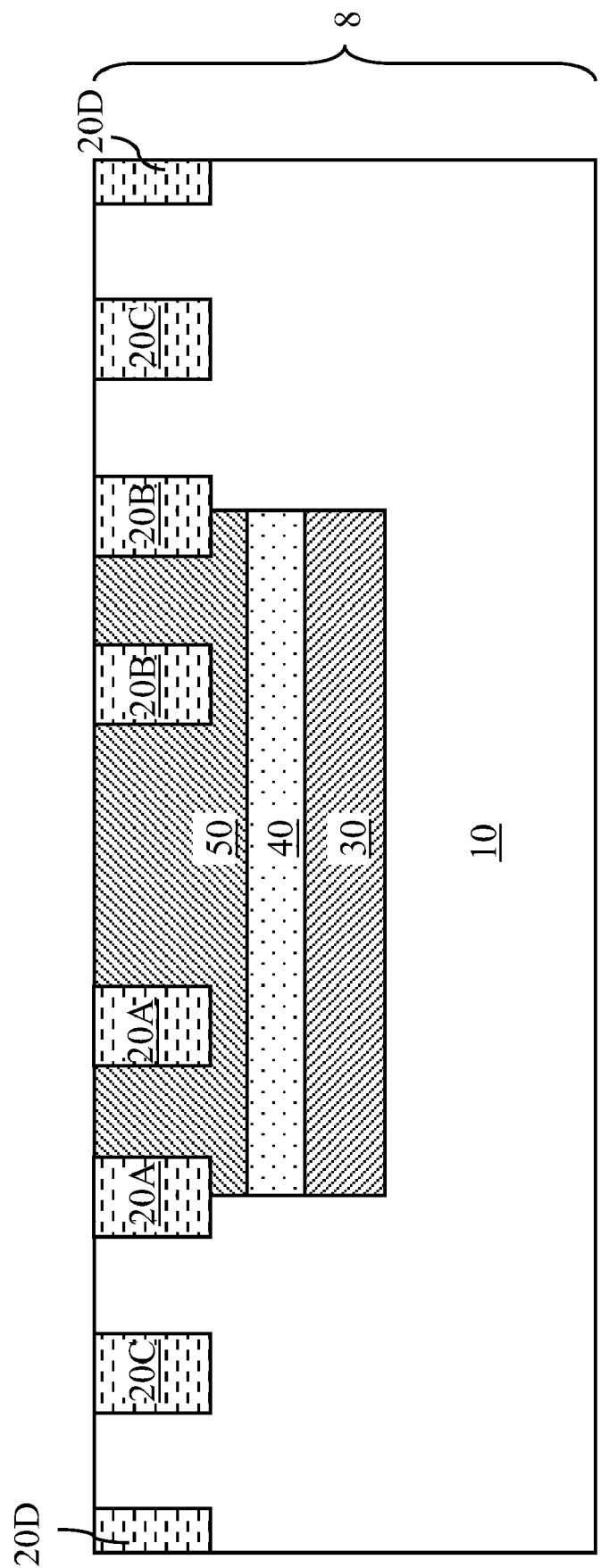
Figure 2B:
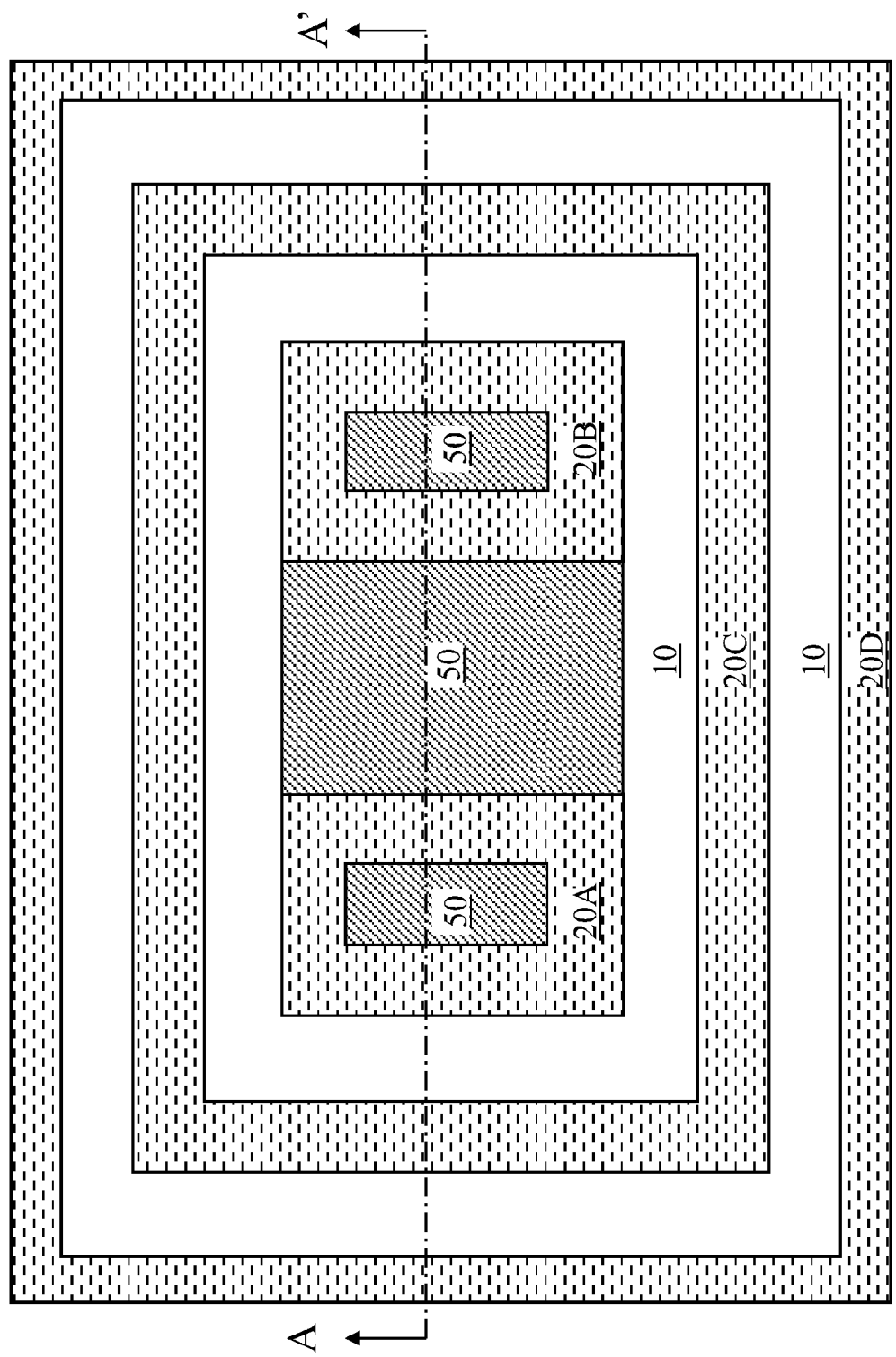

Referring to FIGS. 2A and 2B, a vertical stack, from bottom to top, of an inner first-conductivity-type buried semiconductor layer 30, a lower gate region 40, and a body layer 50. The first-conductivity type buried semiconductor layer 30 has a doping of the first conductivity type. The lower gate region 40 has a doping of the second conductivity type. The body layer 50 has a doping of the first conductivity type. The top surface of the body layer 50 may, or may not, extend to the top surface of the semiconductor substrate 8. Preferably, the top surface of the body layer 50 extends to the top surface of the semiconductor substrate 8. The bottom surface of the body layer 50 is located at a level beneath the bottom surfaces of the shallow trench isolation structures (20A, 20B, 20C, 20D). Thus, the body layer 50 is of integral and unitary construction, i.e., in one contiguous piece.

The vertical stack of the inner first-conductivity-type buried semiconductor layer 30, the lower gate region 40, and the body layer 50 may be formed by forming a patterned ion implantation mask (not shown) having an opening and by implanting dopants into the exposed portions of the semiconductor substrate 8 through the opening in the patterned ion implantation mask. The depths of the bottom surfaces of the inner first-conductivity-type buried semiconductor layer 30, the lower gate region 40, and the body layer 50 are determined by the species and the energy of the implanted ions. The inner first-conductivity-type buried semiconductor layer 30 is a first-conductivity-type buried semiconductor layer that is formed in a portion of the semiconductor layer 10 that underlies the lower gate region 40.

Typically, the bottom surface of the inner first-conductivity-type buried semiconductor layer 30 is located at a depth from 400 nm to 2,000 nm, the bottom surface of the lower gate region 40 is located at a depth from 300 nm to 1,500 nm, and the bottom surface of the body layer is located at a depth from 200 nm to 1,000 nm from the top surface of the semiconductor substrate 8, although lesser and greater depths are contemplated for each of the inner first-conductivity-type buried semiconductor layer 30, the lower gate region 40, and the body layer 50. The lateral outer boundaries of the inner first-conductivity-type buried semiconductor layer 30, the lower gate region 40, and the body layer 50 may be substantially vertically coincident because the same patterned ion implantation mask is employed to implant ions for all of the inner first-conductivity-type buried semiconductor layer 30, the lower gate region 40, and the body layer 50. The patterned ion implantation mask is subsequently removed.

The dopant concentration of the inner first-conductivity-type buried semiconductor layer 30 may be from $3.0 \times 10^{15}/\text{cm}^3$ to $1.0 \times 10^{20}/\text{cm}^3$, although lesser and greater dopant concentrations are also contemplated herein. The dopant concentration of the lower gate region 40 may be from $1.0 \times 10^{17}/\text{cm}^3$ to $1.0 \times 10^{21}/\text{cm}^3$, although lesser and greater dopant concentrations are also contemplated herein. The dopant concentration of the body layer 50 may be from $3.0 \times 10^{15}/\text{cm}^3$ to $1.0 \times 10^{19}/\text{cm}^3$, although lesser and greater dopant concentrations are also contemplated herein.

Figure 3A:
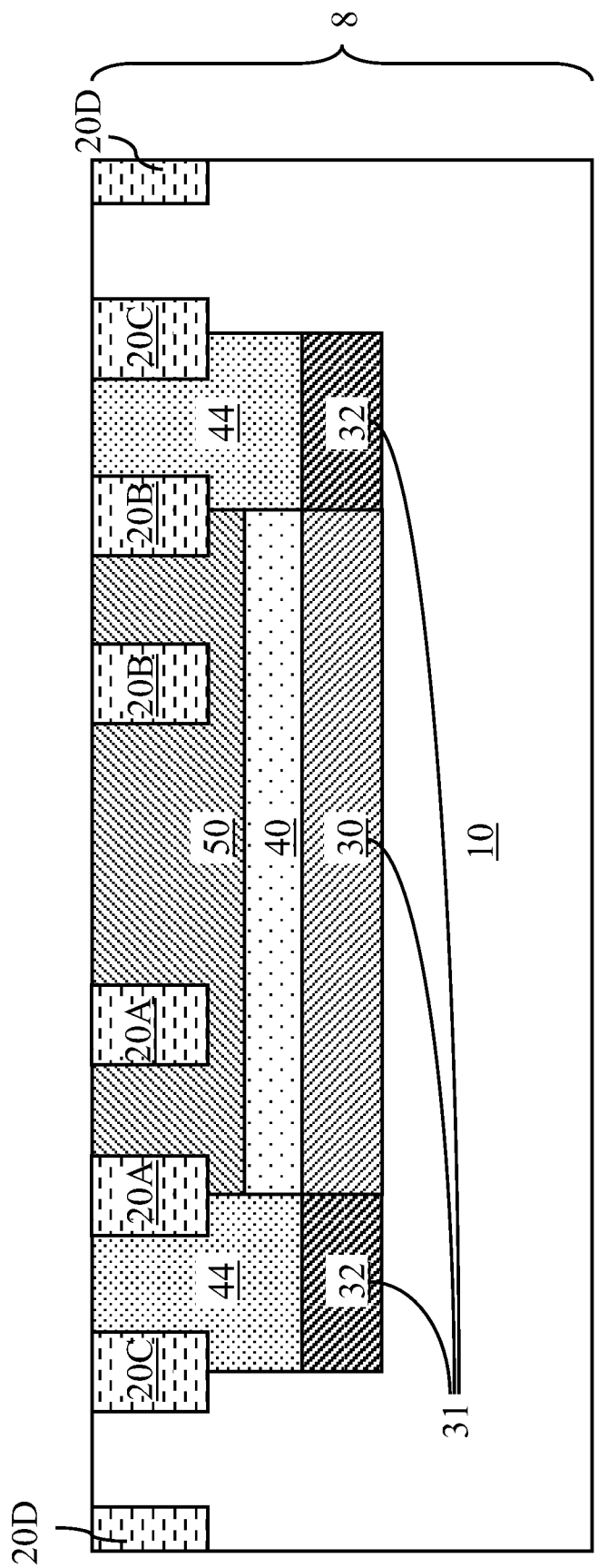
Figure 3B:
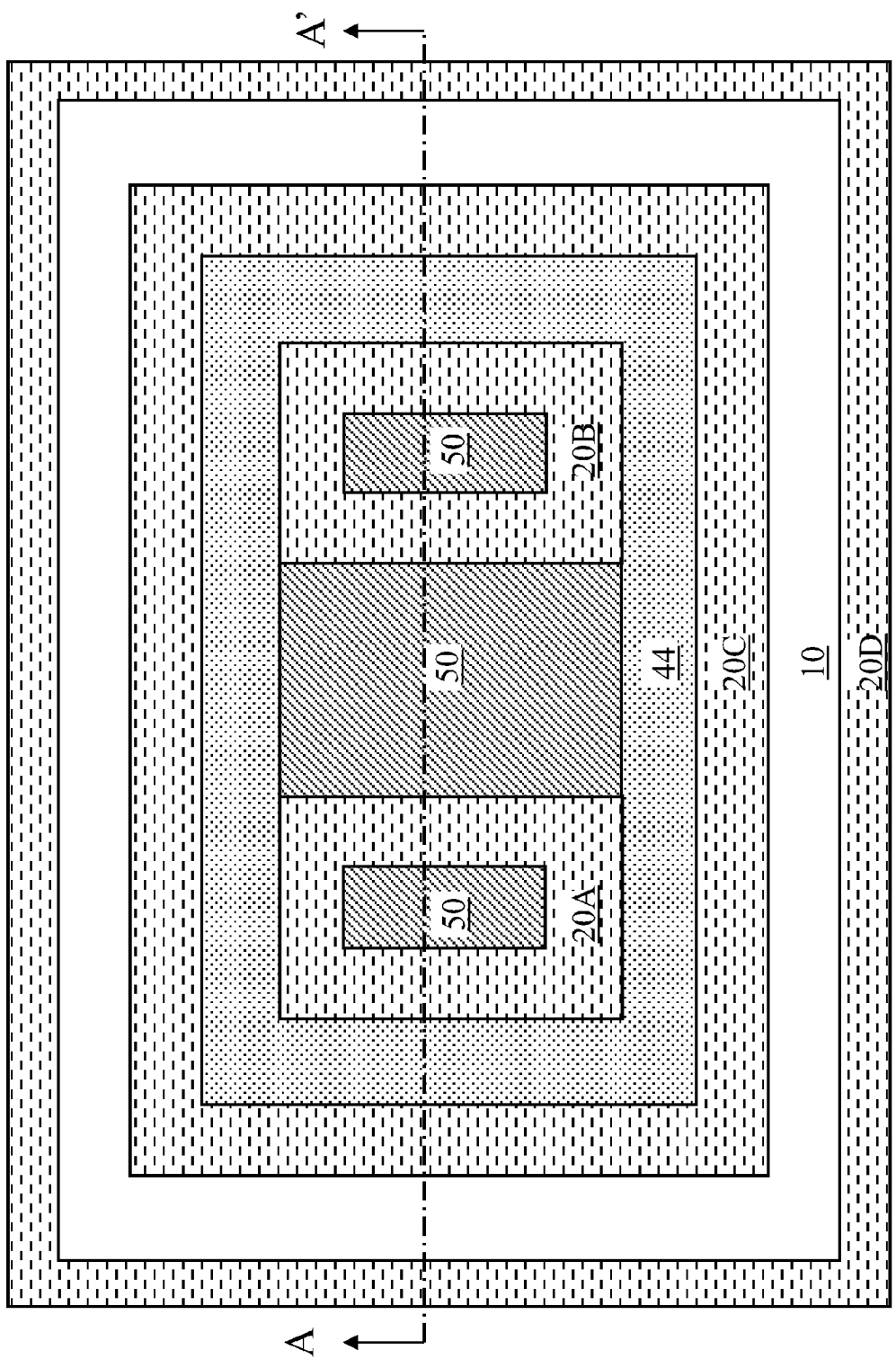

Referring to FIGS. 3A and 3B, a vertical stack, from bottom to top, of an outer first-conductivity-type buried semiconductor layer 32 and a second-conductivity-type reach-through region 44 is formed around and directly on the peripheral surfaces of the inner first-conductivity-type buried semiconductor layer 30, the lower gate region 40, and the body layer 50. Inner peripheral surfaces of the second-conductivity-type reach-through region 44 laterally abut the peripheral surfaces of the lower gate region 40 and the body layer 50. Inner peripheral surfaces of the outer first-conductivity-type buried semiconductor layer 32 laterally abut the peripheral surfaces of the inner first-conductivity-type buried semiconductor layer 30. The outer first-conductivity-type buried semiconductor layer 32 has a doping of the first conductivity type, and the second-conductivity-type reach-through region 44 has a doping of the second conductivity type. A vertical boundary between the outer first-conductivity-type buried semiconductor layer 32 and the second-conductivity-type reach-through region 44 may be located at substantially the same level as, above, or below a vertical interface between the inner first-conductivity-type buried semiconductor layer 30 and the lower gate region 40. The inner first-conductivity-type buried semiconductor layer 30 and the outer first-conductivity-type buried semiconductor layer 32 are collectively referred to as a first-conductivity-type buried semiconductor layer 31.

The vertical stack of the outer first-conductivity-type buried semiconductor layer 32 and the second-conductivity-type reach-through region 44 may be formed by forming another patterned ion implantation mask (not shown) having an opening that surrounds the area of the body layer 50 and by implanting dopants into the exposed portions of the semiconductor substrate 8 through the opening in the patterned ion implantation mask. The depths of the outer first-conductivity-type buried semiconductor layer 32 and the second-conductivity-type reach-through region 44 are determined by the species and the energy of the implanted ions. The depth of the outer first-conductivity-type buried semiconductor layer 32 is set so that the outer first-conductivity-type buried semiconductor layer 32 is electrically connected to the inner first-conductivity-type buried semiconductor layer 30. The depth of the second-conductivity-type reach-through region 44 is set so that the second-conductivity-type reach-through region 44 provides electrical contact to the lower gate region 40.

A first p-n junction is formed between the first-conductivity-type buried semiconductor layer 31 and the semiconductor layer 10. A second p-n junction is formed between the first-conductivity-type semiconductor layer 31 and the lower gate region 40. Another p-n junction is formed between the lower gate region 40 and the body layer 50. Portions of the interface between the second-conductivity-type reach-through region 44 and the body layer 50 may abut a bottom surface of the first shallow trench isolation structure 20A and a bottom surface of the second shallow trench isolation structure 20B.

Figure 4A:
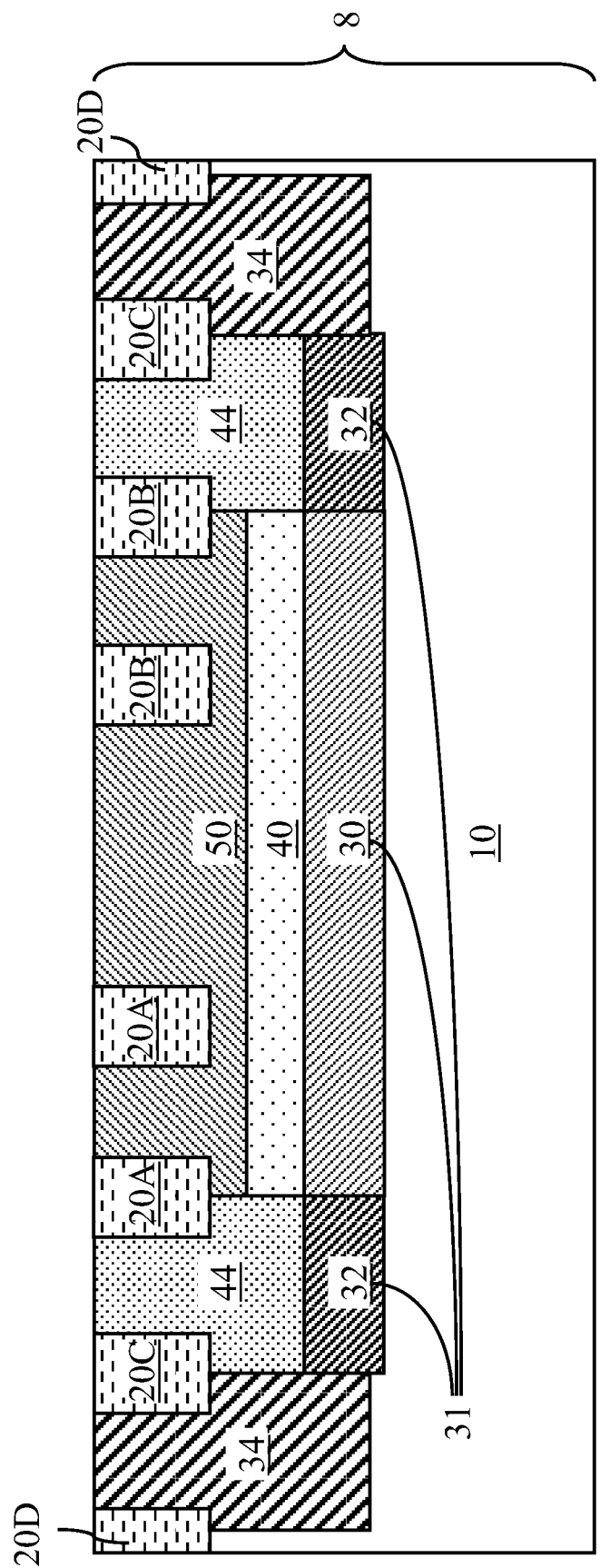
Figure 4B:
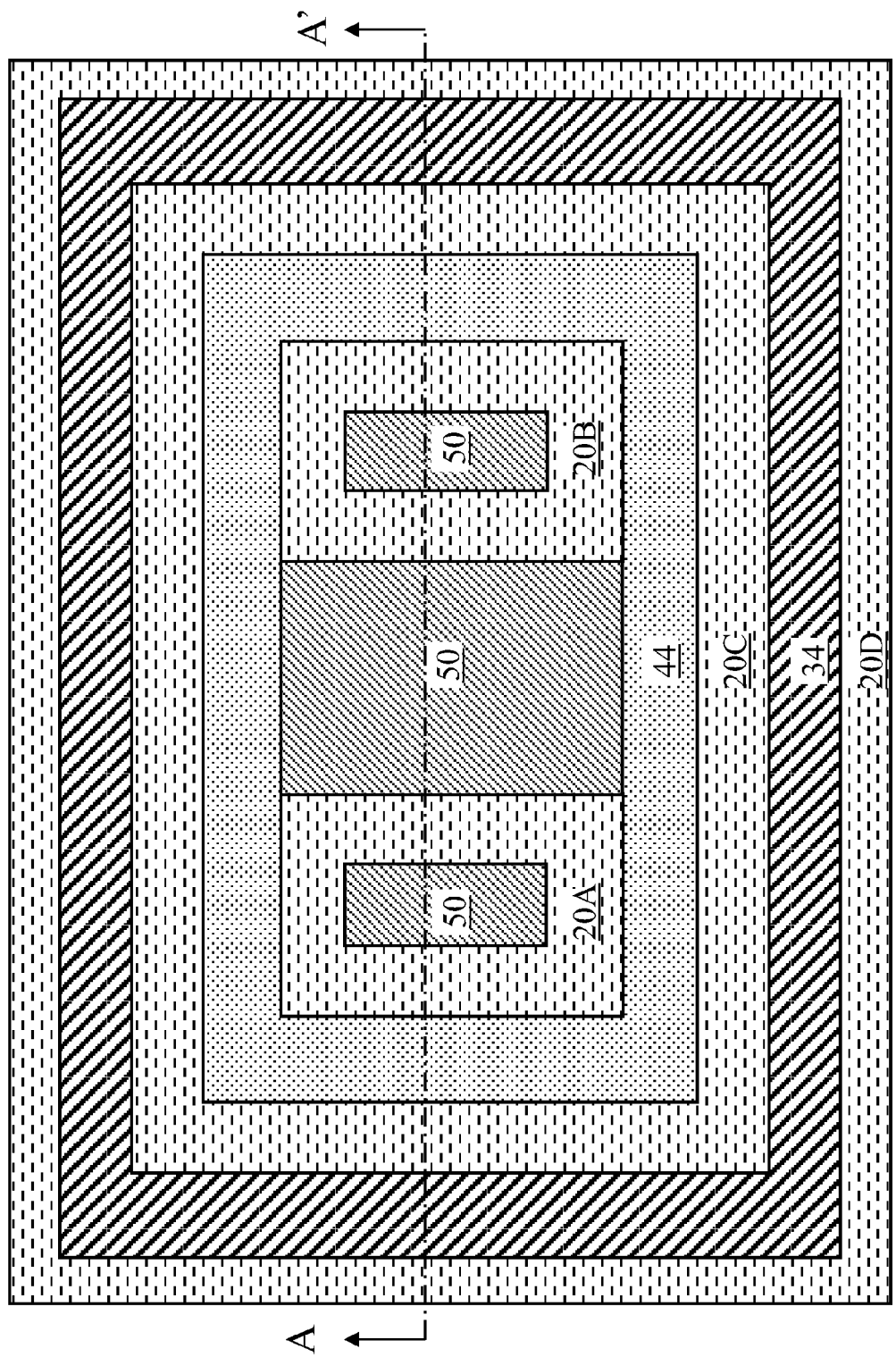

Referring to FIGS. 4A and 4B, a first-conductivity-type reach-through region 34 is formed around and directly on the peripheral surfaces of the outer first-conductivity-type buried semiconductor layer 32 and the second-conductivity-type reach-through region 44. Not necessarily but preferably, the entirety of the interface between first-conductivity-type reach-through region 34 and the second-conductivity-type reach-through region 44 underlies the third shallow trench isolation structure 20C. The depth of the first-conductivity-type reach-through region 34 is set so that the first-conductivity-type reach-through region 34 provides electrical contact to the first-conductivity-type semiconductor layer 31.

Figure 5A:
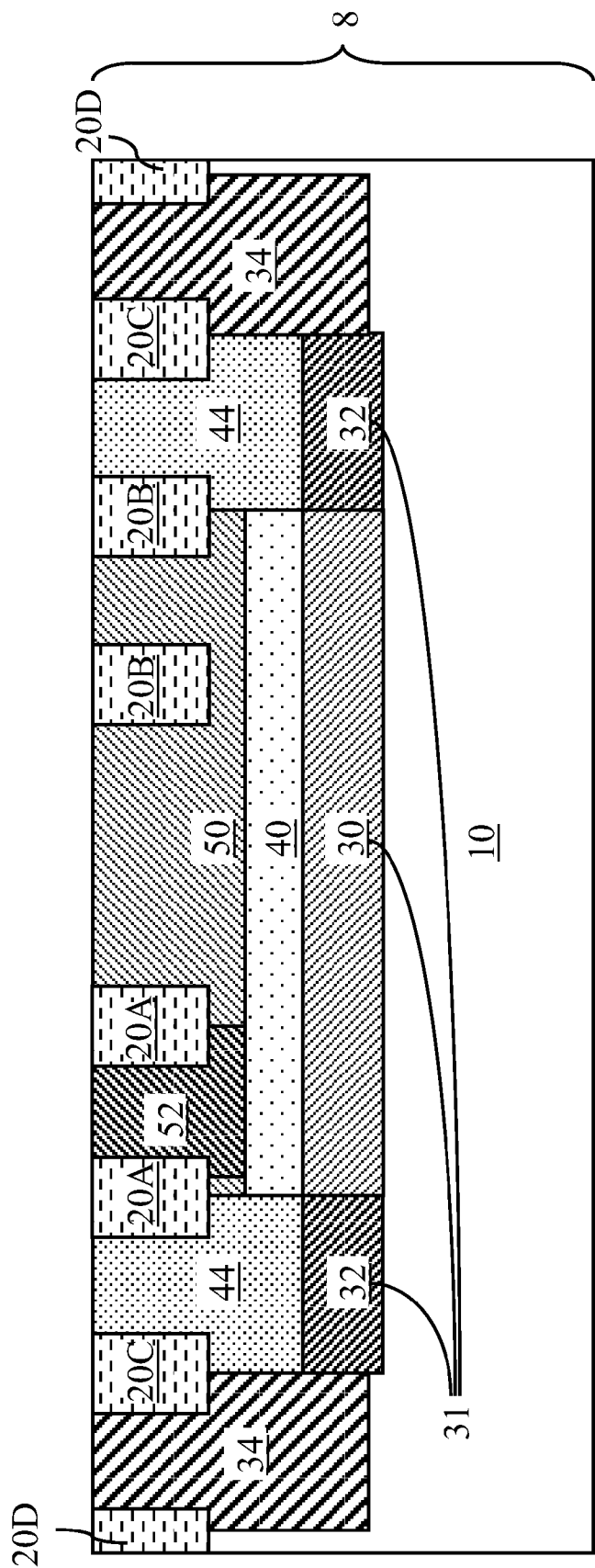
Figure 5B:
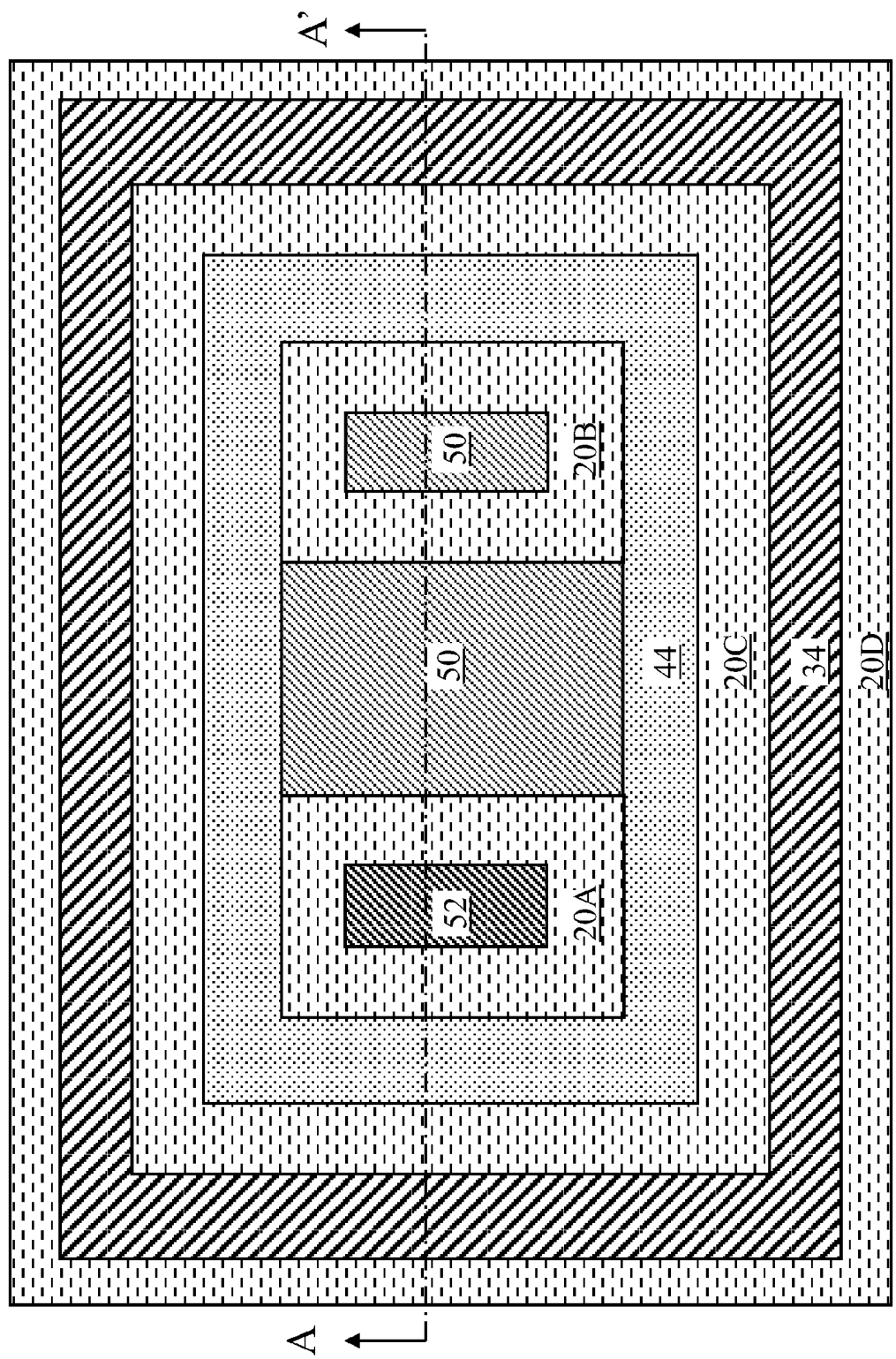

Referring to FIGS. 5A and 5B, dopants of the first conductivity type are implanted into a region of the body layer 50 that is surrounded by the first shallow trench isolation structure 20A to form a lower source region 52 having a doping of the first conductivity type. Formation of the lower source region 52 may be effected by formation of a patterned ion implantation mask (not shown) having an opening in an area including the portion of the body layer 50 that is laterally surrounded by the first shallow trench isolation structure 20A and by implanting dopants of the first conductivity type into the exposed portions of the body layer 50 through the opening in the patterned ion implantation mask. The concentration of dopants of the first conductivity type in the lower source region 52 is greater than the concentration of dopants of the first conductivity type in the body layer 50, which is reduced in volume as the lower source region 52 is formed. For example, the lower source region 52 may have a dopant concentration from $1.0\times10^{18}/cm^3$ to $1.0\times10^{21}/cm^3$, although lesser and greater dopant concentrations are also contemplated herein. The conductivity of the lower source region 52 is greater than the conductivity of the body layer 50 due to the greater dopant concentration in the lower source region 52 relative to the body layer 50.

The top surface of the lower source region 52 may, or may not, abut the top surface of the semiconductor substrate 8. The bottom surface of the lower source region 52 may, or may not, abut the top surface of the lower gate region 40. Preferably, the bottom surface of the lower source region 52 vertically abuts the top surface of the lower gate region 40. The entirety of the periphery of the lower source region 52 may underlie the first shallow trench isolation structure 20A.

Figure 6A:
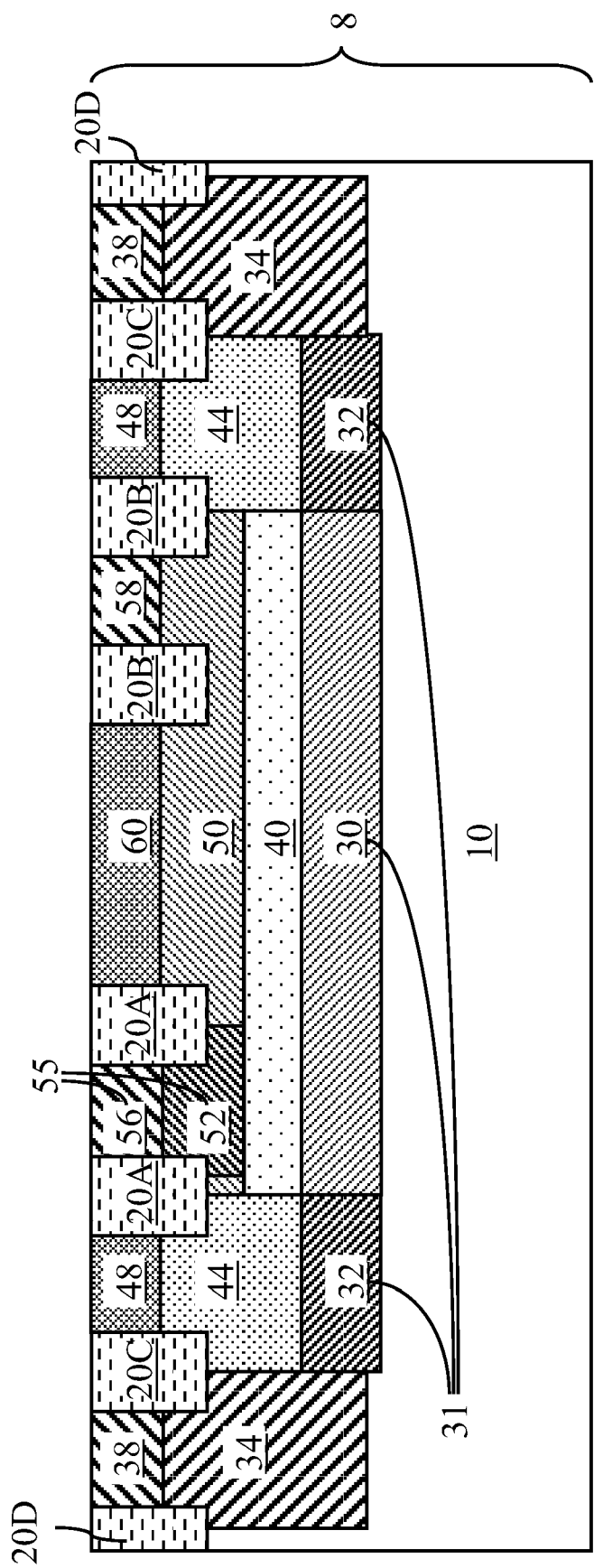
Figure 6B:
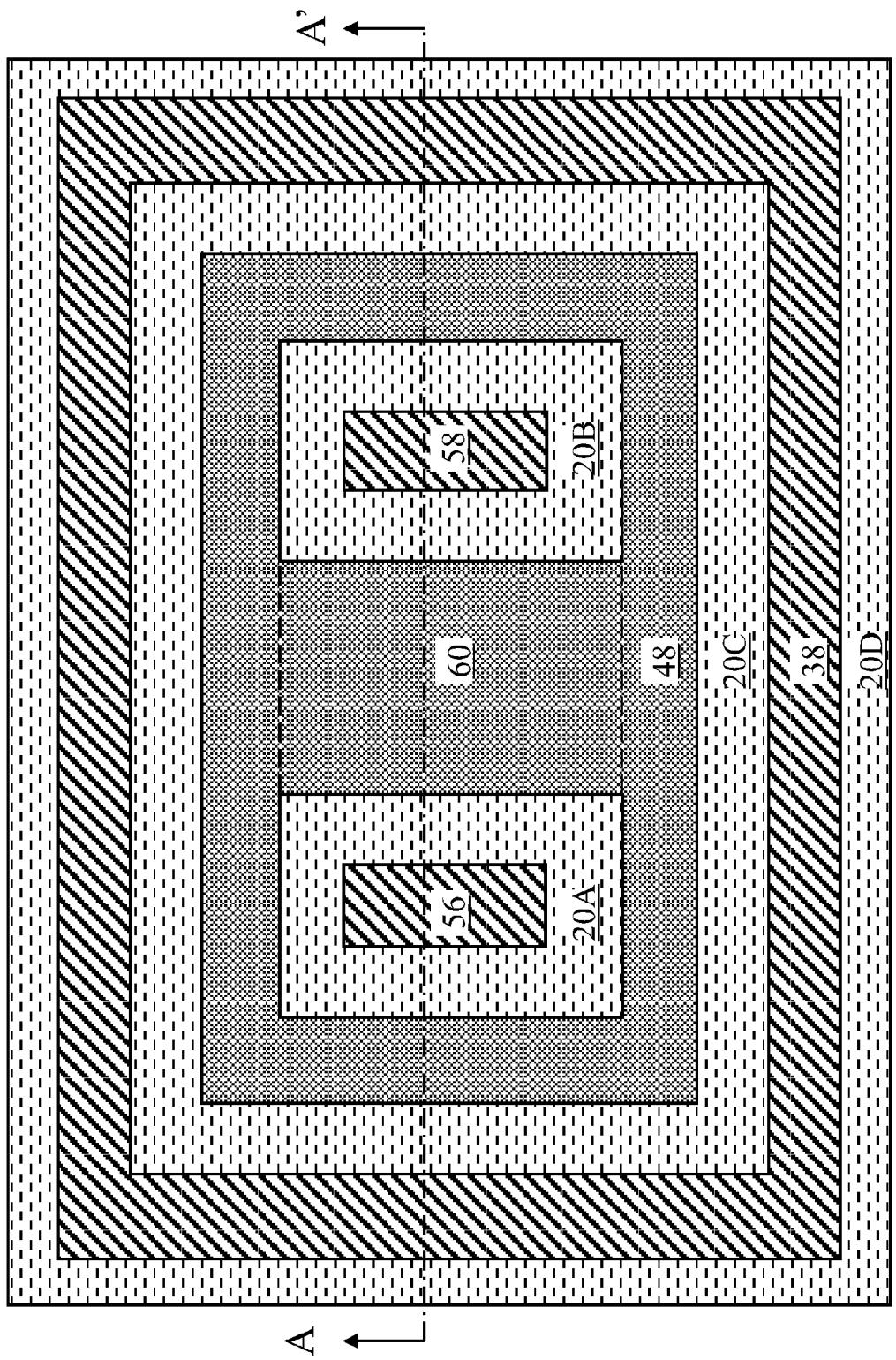

Referring to FIGS. 6A and 6B, additional dopants of the first conductivity type and the second conductivity type are implanted into various portions the semiconductor substrate 8 to increase doping concentrations in the implanted portions. Such increase in the dopant concentrations reduces the resistance of the implanted semiconductor portions.

Specifically, a first ion implantation mask (not shown), which may include a photoresist, is applied over the top surface of the semiconductor substrate 8 and lithographically patterned to form openings in an area surrounded by the first shallow trench isolation structure 20A, an area surrounded by the second shallow trench isolation structure 20B, and the area between the third shallow trench isolation structure 20C and the fourth shallow trench isolation structure 20D. Dopants of the first conductivity type are implanted through the openings in the first ion implantation mask to form an upper source region 56 directly on the lower source region 52, a drain region 58 directly on the body layer 50, and a first-conductivity-type contact region 38 directly on the first-conductivity-type reach-through region 34. The first ion implantation mask is subsequently removed.

Each of the upper source region 56, the drain region 58, and the first-conductivity-type contact region 38 has a doping of the first conductivity type, and may have a dopant concentration from $3.0\times10^{18}/cm^3$ to $5.0\times10^{21}/cm^3$, and typically $3.0\times10^{19}/cm^3$ to $1.0\times10^{21}/cm^3$, although lesser and greater dopant concentrations are also contemplated herein. The depths of the upper source region 56, the drain region 58, and the first-conductivity-type contact region 38 may be substantially the same, and may be from 30 nm to 600 nm, and typically from 60 nm to 300 nm, although lesser and greater depths are also contemplated herein. The depths of the upper source region 56, the drain region 58, and the first-conductivity-type contact region 38 are less than the depths of the shallow trench isolation structures (20A, 20B, 20C, 20D).

Specifically, a second ion implantation mask (not shown), which may include a photoresist, is applied over the top surface of the semiconductor substrate 8 and lithographically patterned to form an opening. The area of the opening includes the area outside the first shallow trench isolation structure 20A and the second shallow trench isolation structure 20B and inside the third shallow trench isolation structure 20C. Dopants of the second conductivity type are implanted through the opening in the second ion implantation mask to form an upper gate region 60 and a lower gate contact region 48. The upper gate region 60 is located between the first shallow trench isolation structure 20A and the second shallow trench isolation structure 20B, and overlies the body layer 50. The lower gate contact region 48 is located outside the area of the body layer 50, and laterally surrounds the first shallow trench isolation structure 20A, the second shallow trench isolation structure 20B, and the upper gate region 60. The upper gate region 60 is formed directly on the body layer 50, and the lower gate contact region 48 is formed directly on the second-conductivity-type reach-through region 44. The second ion implantation mask is subsequently removed.

Each of the upper gate region 60 and the lower gate contact region 48 has a doping of the second conductivity type, and may have a dopant concentration from $3.0\times10^{18}/cm^3$ to $5.0\times10^{21}/cm^3$, and typically $3.0\times10^{19}/cm^3$ to $1.0\times10^{21}/cm^3$, although lesser and greater dopant concentrations are also contemplated herein. The depths of the upper gate region 60 and the lower gate contact region 48 may be substantially the same, and may be from 30 nm to 600 nm, and typically from 60 nm to 300 nm, although lesser and greater depths are also contemplated herein. The depths of the upper gate region 60 and the lower gate contact region 48 are less than the depths of the shallow trench isolation structures (20A, 20B, 20C, 20D).

The upper gate region 60 and the lower gate contact region 48 are of integral and unitary construction, i.e., in one contiguous piece. In other words, no physically observable interface is present between the upper gate region 60 and the lower gate contact region 48. However, the boundary between the upper gate region 60 and the lower gate contact region 48 coincides with portions of the periphery of the body layer 50. The upper gate region 60 overlies the body layer 50, and the lower gate contact region 48 is located outside the area of the body layer 50.

The lower source region 52 and the upper source region 56 collectively constitute a source region 55, which extends from the top surface of the semiconductor substrate 8 to the top surface of the lower gate region 40. The source region 55 is of integral and unitary construction. The source region 55 may have a homogeneous dopant concentration, or may have a vertically graded dopant concentration profile in which the concentration of dopants of the first conductivity type changes with the depth from the top surface of the semiconductor substrate 8.

The source region 55 laterally abuts the body layer 50 at an interface located beneath the bottom surface of the first shallow trench isolation structure 20A. The source region 55 may, or may not, vertically abut the lower gate region 40. Preferably, the source region 55 vertically abuts the lower gate region 40. The source region 55 and the drain region 58 have substantially coplanar top surfaces. However, the bottom surface of the source region 55 is located below a level of the bottommost surface of the drain region 58. Specifically, the bottom surface of the source region 55 is located beneath the bottom surfaces of the shallow trench isolation structures (20A, 20B, 20CC, 20D), and the bottommost surface of the drain region 58 is located above the bottom surfaces of the shallow trench isolation structures (20A, 20B, 20C, 20D). The interface between the lower source region 52 and the upper source region 56 is substantially coplanar with the bottom surface of the drain region 58, which has a substantially planar bottom surface, which is the bottommost surface of the drain region 58. Thus, the drain region 58 does not abut the lower gate region 40.

The source region 55, the drain region 58, the upper gate region 60, the lower gate region 40, the first shallow trench isolation structure 20A, the second shallow trench isolation structure 20B, and the second-conductivity-type reach-through region 44 encapsulates the body layer 50, i.e., completely seals the body layer 50 without a hole.

Preferably, the entirety of the first exemplary semiconductor structure except the shallow trench isolation structures (20A, 20B, 20C, 20D) is single crystalline, and epitaxially aligned to other elements within the first exemplary semiconductor structure. Specifically, the semiconductor layer 10, the first-conductivity-type buried semiconductor layer 31, the first-conductivity-type reach-through region 34, the first-conductivity-type contact region 38, the lower gate region 40, the second-conductivity-type reach-through region 44, the lower gate contact region 48, the body layer 50, the source region 55, the drain region 58, and the upper gate region 60 are single crystalline, and are epitaxially aligned among one another.

Figure 7A:
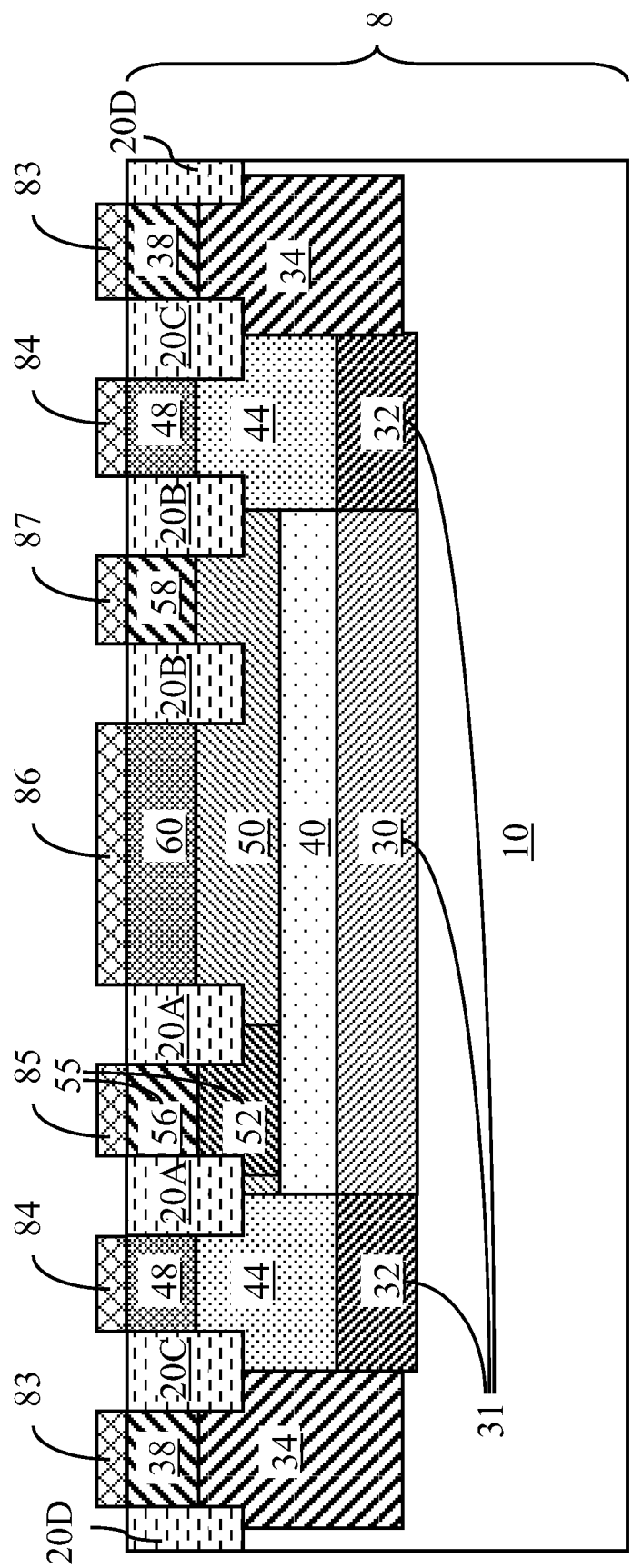
Figure 7B:
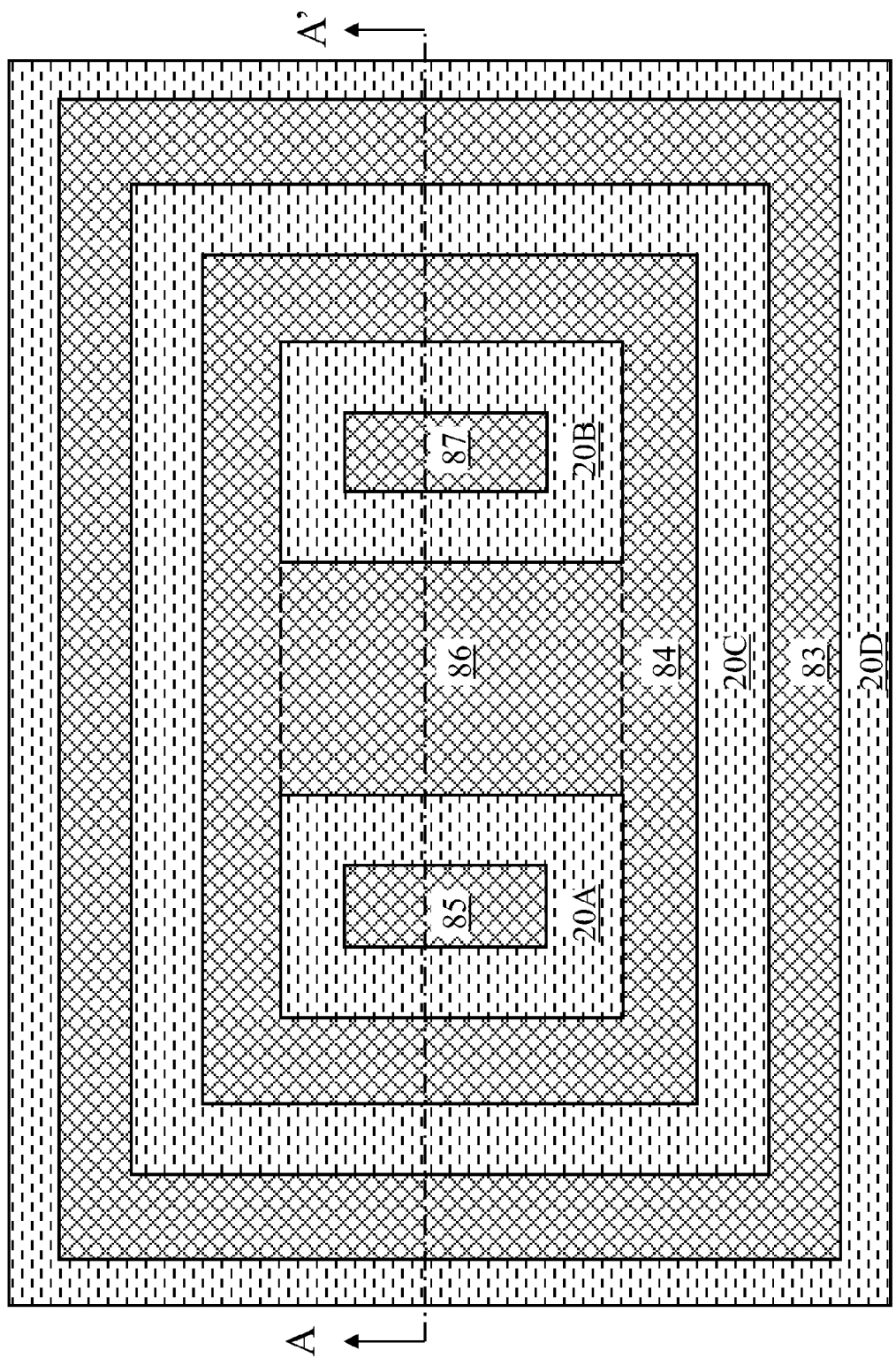

Referring to FIGS. 7A and 7B, various metal semiconductor alloy regions are formed on the exposed semiconductor surfaces on the top surface of the semiconductor substrate 8. The various metal semiconductor alloy regions may be formed by deposition of a metal layer on the top surface of the semiconductor substrate 8, followed by an anneal that induces formation of the various metal semiconductor alloy regions by reacting the metallic material in the metal layer with the semiconductor material underneath. If the underlying semiconductor material includes silicon, the resulting metal semiconductor alloy regions may include a metal silicide. If the underlying semiconductor material includes germanium, the resulting metal semiconductor alloy regions may includes a metal germanide. If the underlying semiconductor material includes a compound semiconductor material, the resulting metal semiconductor alloy regions may include a compound of a metal and the compound semiconductor material. Since formation of the metal semiconductor alloy regions require a semiconductor material, no metal semiconductor alloy region is formed on the shallow trench isolation structures (20A, 20B, 20C, 20D). Unreacted portions of the metal layer are subsequently removed selective to the metal semiconductor alloy regions and the shallow trench isolation structures (20A, 20B, 20C, 20D).

Specifically, a source-side metal semiconductor alloy region 85 is formed directly on the source region 55. A drain-side metal semiconductor alloy region 87 is formed directly on the drain region 58. A first gate-side metal semiconductor alloy region 86 is formed directly on the upper gate region 60. A second gate-side metal semiconductor alloy region 84 is formed directly on the lower gate contact region 48, which is electrically (resistively) connected to the lower gate region 40. A well-biasing metal semiconductor alloy region 83 is formed directly on the first-conductivity-type contact region 38. The first gate-side metal semiconductor alloy region 86 laterally abuts the second gate-side metal semiconductor alloy region 84. The first gate-side metal semiconductor alloy region 86 and the second gate-side metal semiconductor alloy region 84 are of integral and unitary construction.

The first exemplary semiconductor structure constitutes a junction field effect transistor (JFET). The current flows from the source region 55 through the body layer 50 into the drain region 58, or from the drain region 58 through the body layer 50 into the source region 55 depending on the operation of the JFET. The current flow is controlled by the upper gate region 60 and the lower gate region 40. By extending the bottom surface of the source region toward the top surface of the lower gate region 40 and forming a lateral interface underneath a portion of the first shallow trench isolation structure 20A that abuts the body layer 50 and the upper gate region 60, the resistance of the body layer 50 for the current flow between the source region 55 and the drain region 58 is reduced. Thus, the on-current of the JFET is increased relative to prior art JFET's having a source region that does not extend beneath the bottom surfaces of the shallow trench isolation structures (20A, 20B, 20C, 20D).

Figure 8:
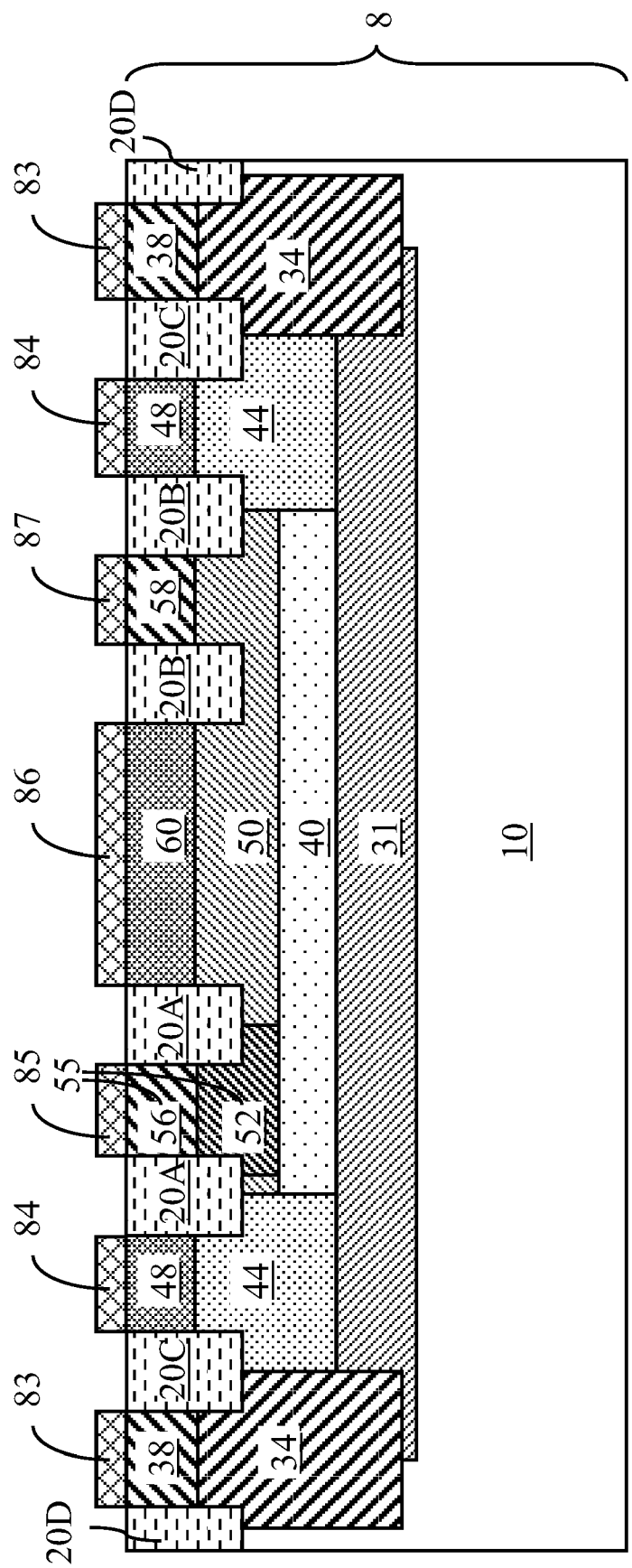
FIG. 8 is a vertical cross-sectional view of a second exemplary semiconductor structure.

Referring to FIG. 8, a second exemplary semiconductor structure according to a second embodiment of the present invention is derived from the first exemplary semiconductor structure by forming a first-conductivity-type buried semiconductor layer 31 in a single ion implantation step without forming an inner first-conductivity-type buried semiconductor layer 30 and outer first-conductivity-type buried semiconductor layer 32 by two separate ion implantation steps employing two separate ion implantation masks. In the second embodiment, the first-conductivity-type buried semiconductor layer 31 may be formed by an ion implantation step that implants dopants of the first conductivity type to a depth below the bottom surface of the lower gate region 40. The first-conductivity-type buried semiconductor layer 31 may be formed simultaneously with formation of other buried semiconductor layers having a doping of the first conductivity type such as a subcollector layer employed in the manufacture of a bipolar transistor or deep n-well utilized for triple well isolation of a NMOS transistor (NFET) in CMOS manufacturing on a p-type substrate. The JFET of the second exemplary semiconductor structure may operate in the same manner as the JFET of the first exemplary semiconductor structure.

Figure 9:
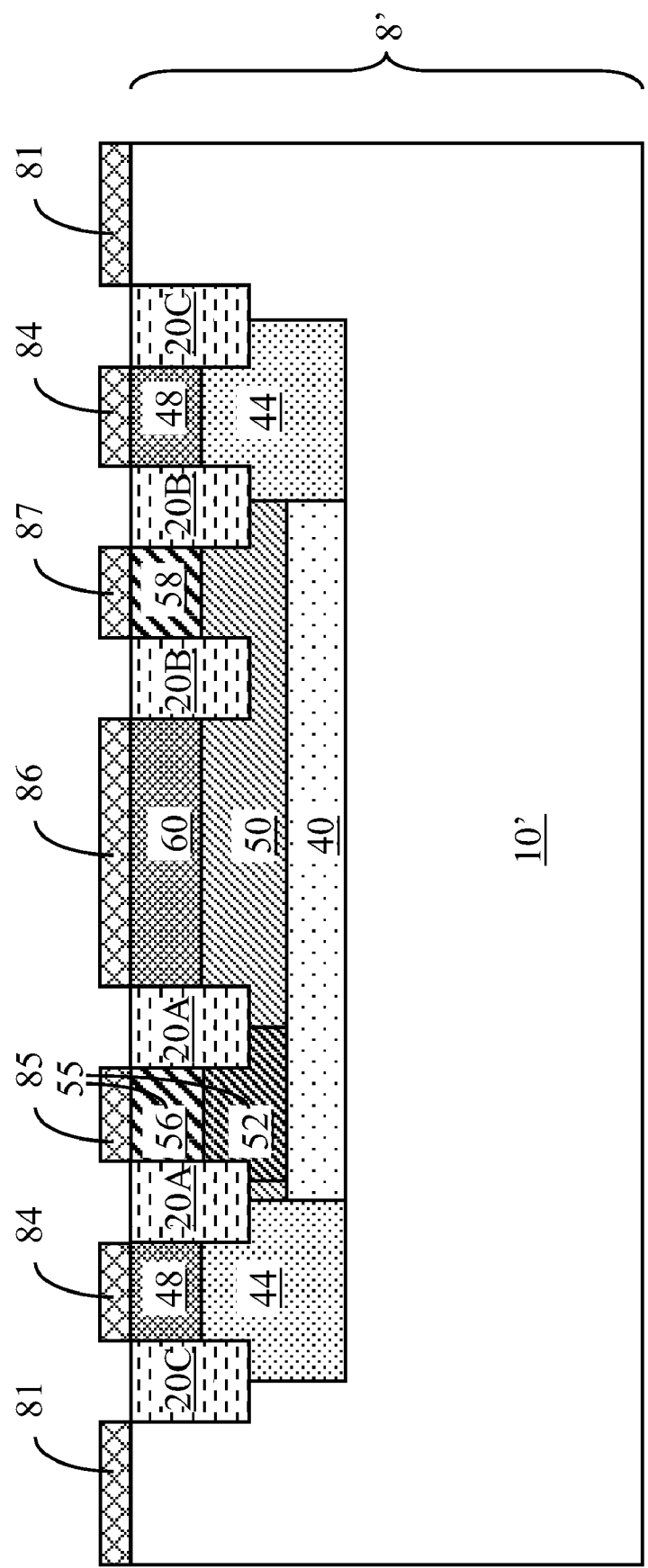
FIG. 9 is a vertical cross-sectional view of a third exemplary semiconductor structure.

Referring to FIG. 9, a third exemplary semiconductor structure according to a third embodiment of the present invention is derived from the first exemplary semiconductor structure by employing a semiconductor substrate 8' that includes a semiconductor layer 10' having a doping of the first conductivity type and by omitting formation of an inner first-conductivity-type buried semiconductor layer 30, an outer first-conductivity-type buried semiconductor layer 32, a first-conductivity-type reach-through region 34, and a first-conductivity-type contact region 38. Thus, a lower gate region 40 and a second-conductivity-type reach-through region 44 are formed directly on the semiconductor layer 10'. A p-n junction is formed between the lower gate region 40 and the semiconductor layer 10'. Another p-n junction is formed between the second-conductivity-type reach-through region 44 and the semiconductor layer 10'. A substrate-side metal semiconductor alloy region 81 may be formed directly on the portion of the semiconductor layer 10' that extends to the top surface of the semiconductor substrate 8', and employed to electrically ground or electrically bias the semiconductor layer 10'.

Preferably, the entirety of the third exemplary semiconductor structure except the shallow trench isolation structures (20A, 20B, 20C) is single crystalline, and epitaxially aligned to other elements within the third exemplary semiconductor structure. Specifically, the semiconductor layer 10', the lower gate region 40, the second-conductivity-type reach-through region 44, the lower gate contact region 48, the body layer 50, the source region 55, the drain region 58, and the upper gate region 60 are single crystalline, and are epitaxially aligned among one another.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a body layer comprising a semiconductor material and having a doping of a first conductivity type and located in a semiconductor substrate;

a source region comprising said semiconductor material and having a doping of said first conductivity type and laterally abutting said body layer;

a drain region comprising said semiconductor material and having a doping of said first conductivity type and laterally abutting said body layer;

an upper gate region comprising said semiconductor material and having a doping of a second conductivity type and vertically abutting a top surface of said body layer, wherein said second conductivity type is the opposite of said first conductivity type; and a lower gate region comprising said semiconductor material and having a doping of said second conductivity type and vertically abutting a bottom surface of said body layer and laterally abutting sidewalls of said body layer and abutting said upper gate region, wherein said source region and said drain region have substantially coplanar top surfaces, and wherein a bottom surface of said source region is located below a level of a bottommost surface of said drain region.

2. The semiconductor structure of claim 1, wherein a bottom surface of said source region abuts a top surface of said lower gate region.

3. The semiconductor structure of claim 2, wherein said drain region does not abut said lower gate region.

4. The semiconductor structure of claim 1, wherein said body layer, said source region, and said drain region are single crystalline and epitaxially aligned among one another.

5. The semiconductor structure of claim 4, wherein said upper gate region and said lower gate region are single crystalline, and wherein said body layer, said source region, said drain region, said upper gate region, and said lower gate region are epitaxially aligned among one another.

6. The semiconductor structure of claim 1, further comprising:

a first shallow trench isolation structure comprising a dielectric material and laterally surrounding an upper portion of said source region;

a second shallow trench isolation structure comprising said dielectric material and laterally surrounding said drain region; and a second-conductivity-type reach-through region comprising said semiconductor material, having a doping of said second conductivity type, and laterally abutting said lower gate region.

7. The semiconductor structure of claim 6, wherein said source region, said drain region, said upper gate region, said lower gate region, said first shallow trench isolation structure, said second shallow trench isolation structure, and said second-conductivity-type reach-through region encapsulates said body layer.

8. The semiconductor structure of claim 6, wherein said second-conductivity-type reach-through region is single crystalline and is epitaxially aligned to said body layer, said source region, said drain region, said upper gate region, and said lower gate region.

9. The semiconductor structure of claim 8, further comprising:

a third shallow trench isolation structure abutting said second-conductivity-type reach-through region and laterally enclosing but not abutting said first shallow trench isolation structure and said second shallow trench isolation structure; and a fourth shallow trench isolation structure abutting said second-conductivity-type reach-through region and laterally enclosing but not abutting said third shallow trench isolation structure.

10. The semiconductor structure of claim 1, further comprising a semiconductor layer comprising said semiconductor material, having a doping of said first conductivity type, and located in said semiconductor substrate, wherein said semiconductor layer vertically abuts a bottom surface of said lower gate region.

11. The semiconductor structure of claim 1, further comprising:

a first-conductivity-type buried semiconductor layer comprising said semiconductor material, having a doping of said first conductivity type, vertically abutting a bottom surface of said lower gate region, and located in said semiconductor substrate; and a semiconductor layer comprising said semiconductor material, having a doping of said second conductivity type, and located in said semiconductor substrate, wherein said semiconductor layer vertically abuts a bottom surface of first-conductivity-type buried semiconductor layer.

12. The semiconductor structure of claim 11, further comprising a first-conductivity-type reach-through region comprising said semiconductor material, having a doping of said first conductivity type, and laterally abutting said first-conductivity-type buried semiconductor layer.

13. The semiconductor structure of claim 11, wherein said first-conductivity-type buried semiconductor layer and said semiconductor layer are single crystalline and are epitaxially aligned to said body layer, said source region, said drain region, said upper gate region, and said lower gate region.

14. The semiconductor structure of claim 1, further comprising:

a source-side metal semiconductor alloy region vertically abutting said source region;

a drain-side metal semiconductor alloy region vertically abutting said drain region;

a first gate-side metal semiconductor alloy region vertically abutting said upper gate region; and a second gate-side metal semiconductor alloy region laterally abutting said first gate-side metal semiconductor alloy region and electrically connected to said lower gate region.

15. The semiconductor structure of claim 14, further comprising:

a second-conductivity-type reach-through region comprising said semiconductor material, having a doping of said second conductivity type, and laterally abutting said lower gate region; and a second-conductivity-type contact region comprising said semiconductor material, having a doping of said second conductivity type, and vertically abutting said second-conductivity-type reach-through region and said second gate-side metal semiconductor alloy region.

* * * * *